United States Patent [19]
Wallace

[11] Patent Number: 5,897,362
[45] Date of Patent: Apr. 27, 1999

[54] BONDING SILICON WAFERS

[75] Inventor: Steven W. Wallace, Fleetwood, Pa.

[73] Assignee: Lucent Technologies Inc., Murray Hill, N.J.

[21] Appl. No.: 09/062,606

[22] Filed: Apr. 17, 1998

[51] Int. Cl.$^6$ .............................. H01L 21/30; H01L 21/46
[52] U.S. Cl. ........................... 438/455; 438/456; 438/458
[58] Field of Search ............................................. 438/455

[56] References Cited

U.S. PATENT DOCUMENTS

| | | | |
|---|---|---|---|
| 5,539,245 | 7/1996 | Imura et al. | 438/455 |
| 5,603,779 | 2/1997 | Linn et al. | 438/455 |
| 5,688,714 | 11/1997 | Widdershoven et al. | 438/455 |

*Primary Examiner*—Kevin M. Picardat
*Assistant Examiner*—Deven Collins

[57] ABSTRACT

The specification describes a gettering technique for bonded wafers. The handle wafer is provided with a phosphorus predeposition to getter impurities from the handle wafer. The surface to be bonded of the handle wafer is then polished to prepare the wafer for bonding. During polishing the top side phosphorus layer is removed, thereby eliminating the potential for updiffusion of phosphorus from the gettering layer into the device regions of the device layer. The phosphorus gettering layer on the backside of the handle wafer is retained for additional gettering during the bonding operation and during subsequent processing of the device wafer.

9 Claims, 1 Drawing Sheet

BONDING SILICON WAFERS

FIELD OF THE INVENTION

This invention relates to methods for bonding silicon wafers together to form electrically isolated device substrates.

BACKGROUND OF THE INVENTION

High voltage and high power semiconductor integrated circuit devices require unusual isolation structures to provide effective electrical isolation between adjacent devices in the semiconductor substrate. A common technique is to form buried oxide tubs around a silicon substrate region. The typical fabrication method is to etch deep trenches in a single crystal silicon substrate, oxidize the silicon in the trenches, and deposit a thick layer of polysilicon over the etched silicon surface. The polysilicon layer serves as the substrate or "handle" for the wafer during subsequent processing to form the integrated circuit. The bottom surface of the single crystal silicon wafer is polished away to reveal the oxide trenches thus leaving isolated islands of single crystal silicon in the polysilicon handle wafer.

More recently, techniques have become available for hydrophilic bonding of silicon wafers. Using this technique, an isolating layer is formed on the surface of one of the silicon wafers and that surface is bonded to another silicon wafer, thus forming a two wafer "sandwich" with an isolating layer there between. Isolation trenches are then formed through the thickness of the device wafer with the trenches essentially encircling and isolating silicon regions of the device wafer. In an implementation of the well known dielectric isolation technique, the isolation layer is an oxide layer, as described in U.S. Pat. No. 5,478,758. An alternative approach is to use a junction isolation layer, i.e. a heavily doped layer, as the isolation layer. In this approach the bond for the bonded wafer is silicon to silicon which is easily implemented using hydrophilic bonding. In both cases the surfaces being bonded are highly polished.

In bonded wafer technology in general, the gettering of impurities has been a manufacturing and performance issue. Impurities that originate from the interface are a source of contamination in the finished device. It is also predictable that a substantial source of device contamination results from impurities present during the wafer bonding operation, and in particular, impurities that originate from the handle wafer. Backside gettering as generally used in semiconductor technology is ineffective with bonded wafers due to the thickness of the bonded structure and the presence of the barrier at the bonded wafer interface. Thus, as described in the patent referenced above, front side gettering from gettering layers formed in the side trenches on the device side of the bonded wafer is typically the method of choice. However, it is evident that the front side gettering approach of the patent cited above is ineffective for gettering impurities at this early stage of wafer production.

It would beneficial to remove the handle wafer as a source of contamination and to getter impurities from the wafers being bonded at an early stage in the manufacturing operation, i.e. before the bonded interface is formed.

SUMMARY OF THE INVENTION

I have developed an impurity gettering technique for use with bonded wafer technology that is effective in gettering impurities prior to and during the wafer bonding step. This gettering technique employs a predeposit of phosphorus on the handle wafer that effectively insures that the handle wafer is not a source of impurity contamination. The phosphorus predeposit is formed on both surfaces of the handle wafer for initial gettering. To avoid problems with updiffusion of phosphorus from the bonded interface, the phosphorus layer is removed prior to bonding. This is conveniently accomplished during the step of polishing the surface of the handle wafer in preparation for wafer bonding. The phosphorus predeposit remaining on the backside of the handle wafer continues to be effective for gettering impurities during the bonding operation and during subsequent device manufacturing steps.

DETAILED DESCRIPTION

Figure 1:
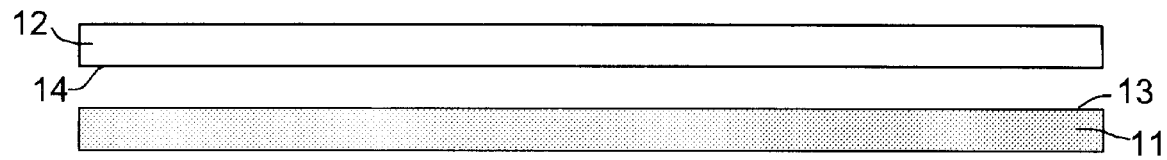
FIGS. 1 and 2 are representations of silicon wafers prior to and subsequent to conventional wafer bonding, showing the potential for contamination of the device wafer from impurities in the handle wafer.

With reference to FIG. 1 a pair of silicon wafers is shown prior to conventional wafer bonding. Wafer 11 is the handle wafer and wafer 12 the device wafer. The thickness of the wafers illustrated in this description are exaggerated for clarity. In the bonding technique described here, electrical isolation is obtained by heavily doping the handle wafer 11. For example, handle wafer 11 may be arsenic doped to a resistivity in the range 0.001–1.0 $\Omega$cm. Other n-type impurities can be used but arsenic is the preferred dopant since it is a slow diffuser relative to e.g. phosphorus, and thus is more resistant to unwanted updiffusion during device processing. The device wafer 12 is typically high resistivity silicon, e.g. 100–1000 $\Omega$cm, and for most silicon IC devices is n-doped with phosphorus or arsenic.

Figure 2:

The wafers are typically double side polished as the first step of the wafer bonding operation. These wafers have a total thickness variation of less than 3 $\mu$m. The sides of the wafers to be bonded together are then polished again, giving extremely low surface roughness, e.g. 2 Å$\mu$m$^2$ RMS, in preparation for bonding. Conventional bonding wafer technology using hydrophilic bonding, i.e. with silicon to silicon bonds, requires maximum atomic contact to be effective. After ultra-smooth polishing, the wafers are then placed in contact as shown in FIG. 2, and heated in an inert atmosphere. Temperatures in the range 900–1200° C. for five minutes to five hours are typical conditions used to effect the bond. If the handle wafer 11 is contaminated with unwanted impurities, as suggested by the shading in FIGS. 1 and 2, these impurities will diffuse to the device wafer 12, causing deterioration of device performance in the integrated circuit.

Contamination of the device wafer from the handle wafer may be reduced to some extent if the electrically isolating barrier is an oxide layer. However, while an oxide layer serves effectively as electrical isolation it is not a reliable barrier against contamination. Impurities such as sodium diffuse rapidly through $SiO_2$. Consequently this invention can be applied advantageously also to bonded wafers with an intervening oxide layer. The oxide layer is typically formed by thermal oxidation and can be present on either the device wafer or the handle wafer, or both. Oxide thicknesses for electrical isolation are typically in the range 0.4 to 2.0 $\mu$m.

To overcome the problem of contamination from the handle wafer, especially during the wafer bonding operation, the handle wafer is provided with a phosphorus predeposit. The result is the formation of a p-glass gettering layer on both major surfaces of the handle wafer. This gettering layer serves to trap mobile impurities in the handle wafer so that when joined to the device wafer the handle wafer is "clean".

The use of phosphorus for the gettering layer is preferred, since phosphorus is an effective gettering material. However, the presence of a high concentration of phosphorus at the interface between bonded wafers is undesirable, because of the potential for updiffusion of phosphorus, a fast diffusing impurity, into the active regions of the device layer. Consequently, an important step in the process of the invention is to remove the surface layer of phosphorus from the handle wafer prior to bonding the wafers together. This result can be achieved without additional processing if the phosphorus predeposition is made prior to the final silicon wafer polishing step. Using that step sequence, the phosphorus layer on the surface to be bonded is removed during polishing. However, the backside phosphorus gettering layer remains for additional gettering during subsequent wafer processing.

Figure 3:
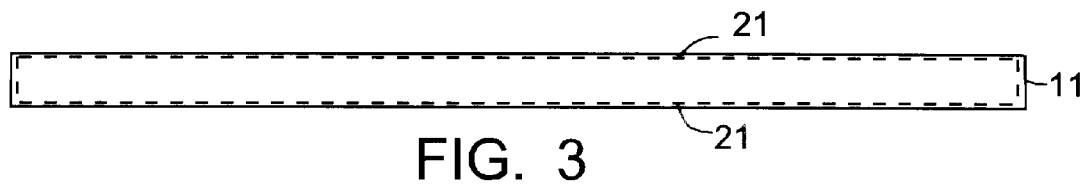
FIGS. 3–6 are representations of silicon wafers processes in accordance with the invention.

This sequence is shown in FIGS. 3–6. With reference to FIG. 3, the phosphorus glass gettering layer is shown at 21, and is present on both major surface of the handle wafer 11. The phosphorus predeposit may be formed by known techniques, e.g. using $POCl_3$ treatment in a diffusion furnace at 950–1050° C. for 20 to 80 minutes. The layer is preferably 0.5–3.0 $\mu$m thick with a resistivity in the range $5.0\times10^{18}$–$1\times10^{20}$ atoms/cm$^3$. The thickness is preferably kept below the thickness of silicon removed in the final polish, typically 3 $\mu$m or less. After deposition of the p-glass the wafer may be heated to effect gettering. Heating and gettering occurs during p-glass deposition so additional heating is optional.

Figure 4:
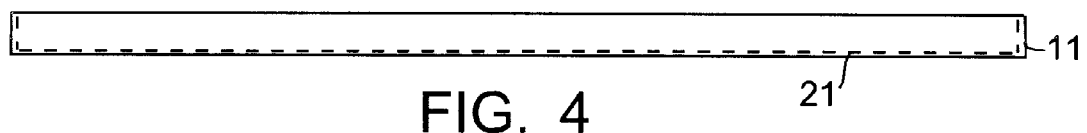

The final prebonding polish is then performed on the handle wafer as shown in FIG. 4. This step removes the p-glass layer from the top surface while leaving p-glass layer 21 on the backside of the handle wafer. The polish is conventional, using standard polishing apparatus. Approximately 1–3 $\mu$m of silicon are typically removed. It is preferred that all the phosphorus be removed from the bonding side of the handle wafer during this step.

Figure 5:
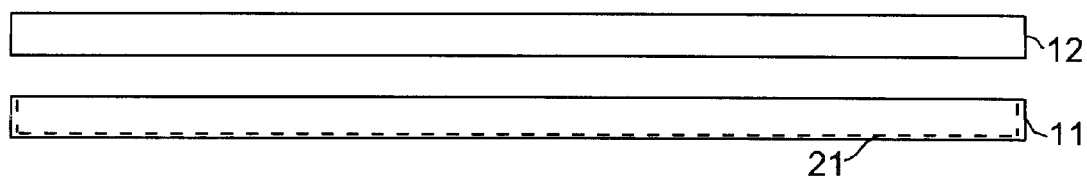
Figure 6:
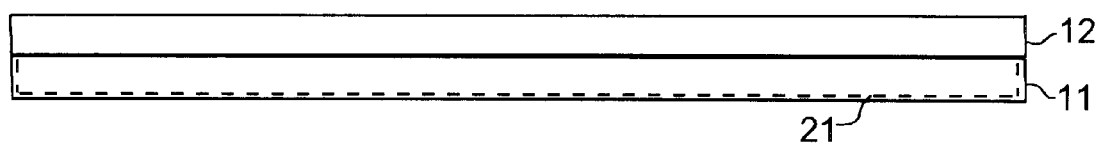

The handle wafer is then bonded to the device wafer as shown in FIGS. 5 and 6. During these steps the gettering layer 21 remains on the backside of the handle wafer 11 to provide additional impurity gettering. The wafers are placed in contact as shown and bonded by heating e.g. to 1100° C. for 2 hours in an inert, e.g. argon or $N_2$, furnace or oxygen ambient. The device wafer 12 is then thinned to specification.

The handle wafer in a typical bonded wafer structure serves primarily as a substrate to support the device wafer. However, the handle wafer according to this invention provides the additional function of gettering, both during and after the wafer bonding operation. Both the handle wafer and the device wafer have a conventional thickness, i.e. in the range 500–550 $\mu$m for a 100 mm wafer, or 600–650 $\mu$m for a 125 mm wafer. Typically the thickness of the wafers will be the same, but it should be evident that this is not an important condition.

Reference is made herein to top and bottom surfaces, which may be inverted if desired.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A process for bonding a silicon device wafer to a silicon handle wafer, said silicon wafers having a top major surface and a bottom major surface, comprising the steps of:
    a. depositing a layer comprising phosphorus on both the said top surface and the said bottom surface of said handle wafer,
    b. polishing said top surface of said handle wafer to remove said phosphorus layer from said top surface, leaving said layer comprising phosphorus on said bottom layer,
    c. placing the bottom surface of said device wafer and the top surface of said handle wafer in contact, and
    d. bonding said device wafer to said handle wafer by heating said wafers.

2. The process of claim 1 in which the phosphorus layer comprises p-glass.

3. The process of claim 1 in which the layer comprising phosphorus is deposited by exposing the said handle wafer to an atmosphere comprising $POCl_3$.

4. The process of claim 1 in which the said layer comprising phosphorus is less than 3.0 $\mu$m thick.

5. The process of claim 1 wherein the wafers are heated to a temperature in the range 900–1200° C. to bond the wafers together.

6. The process of claim 1 wherein the handle wafer is arsenic doped to a resistivity in the range 0.001–1.0 $\Omega$cm.

7. The process of claim 6 wherein the device wafer is phosphorus doped to a resistivity in the range 100–1000 $\Omega$cm.

8. The process of claim 1 wherein the layer comprising phosphorus has a phosphorus concentration in the range $5\times10^{18}$–$1.0\times10^{20}$ atoms/cm$^3$.

9. A process for bonding a silicon device wafer to a silicon handle wafer, said silicon wafers having a top major surface and a bottom major surface, comprising the steps of:
    a. polishing said device wafer to produce a substantially flat topography on at least the bottom surface thereof,
    b. polishing said handle wafer to produce a substantially flat topography on at least the top surface thereof,
    c. depositing a layer comprising phosphorus on both the said top surface and the said bottom surface of said handle wafer,
    d. polishing said top surface of said handle wafer to remove said phosphorus layer from said top surface,
    e. placing said bottom surface of said device wafer and said top surface of said handle wafer in contact, and
    f. bonding said device wafer to said handle wafer by heating said wafers.

\* \* \* \* \*